US008221546B2

(12) United States Patent
Zhang (10) Patent No.: US 8,221,546 B2
(45) Date of Patent: Jul. 17, 2012

(54) EPITAXIAL GROWTH ON LOW DEGREE OFF-AXIS SIC SUBSTRATES AND SEMICONDUCTOR DEVICES MADE THEREBY

(75) Inventor: Jie Zhang, Starkville, MS (US)

(73) Assignee: SS SC IP, LLC, Jackson, MS (US)

( * ) Notice: Subject to any disclaimer, the term of this patent is extended or adjusted under 35 U.S.C. 154(b) by 1116 days.

(21) Appl. No.: 12/055,725

(22) Filed: Mar. 26, 2008

(65) Prior Publication Data

US 2009/0242899 A1    Oct. 1, 2009

(51) Int. Cl.
*C30B 21/02*    (2006.01)
(52) U.S. Cl. ............... 117/84; 117/86; 117/90; 117/95; 117/96
(58) Field of Classification Search ............ 117/84, 117/86, 90, 95, 96
See application file for complete search history.

(56) References Cited

U.S. PATENT DOCUMENTS

| 4,824,711 | A | * | 4/1989 | Cagliostro et al. ............ 428/116 |
| 4,865,659 | A | | 9/1989 | Shigeta et al. |
| 4,912,064 | A | | 3/1990 | Kong et al. |
| 5,011,549 | A | | 4/1991 | Kong et al. |
| 5,248,385 | A | | 9/1993 | Powell |
| 5,915,194 | A | * | 6/1999 | Powell et al. ................ 438/478 |
| 6,461,944 | B2 | * | 10/2002 | Neudeck et al. ............. 438/478 |
| 6,488,771 | B1 | * | 12/2002 | Powell et al. ................ 117/89 |
| 7,247,513 | B2 | | 7/2007 | Kordina |

| 2008/0308906 | A1 | | 12/2008 | Osada et al. |
| 2009/0230406 | A1 | * | 9/2009 | Ellison et al. .................. 257/77 |
| 2009/0242899 | A1 | * | 10/2009 | Zhang ............................ 257/77 |

FOREIGN PATENT DOCUMENTS

| EP | 0962963 A1 | 12/1999 |
| EP | 1619276 A2 | 1/2006 |
| EP | 1783250 A2 | 5/2007 |
| JP | 2002-514355 A | 5/2002 |
| JP | 2007-81144 A | 3/2007 |
| WO | 2005093137 A1 | 10/2005 |

OTHER PUBLICATIONS

La Via, et al., "Very high growth rate epitaxy process with chlorine addition," Materials Science Forum, vols. 556-557, pp. 157-160 (2007).
La Via, et al., "Expitaxial layers grown with HCl addition: A comparison with the standard process," Materials Science Forum, vols. 527-529, pp. 163-166 (2006).
Crippa, et al., "New achievements on CVD based methods for SiC epitaxial growth," Materials Science Forum, vol. 483-485 pp. 67-72 (2005).

(Continued)

*Primary Examiner* — Bob M Kunemund
(74) *Attorney, Agent, or Firm* — Morris, Manning & Martin, LLP; Christopher W. Raimund (57) ABSTRACT

A method of epitaxially growing a SiC layer on a single crystal SiC substrate is described. The method includes heating a single-crystal SiC substrate to a first temperature of at least 1400° C. in a chamber, introducing a carrier gas, a silicon containing gas and carbon containing gas into the chamber; and epitaxially growing a layer of SiC on a surface of the SiC substrate. The SiC substrate is heated to the first temperature at a rate of at least 30° C./minute. The surface of the SiC substrate is inclined at an angle of from 1° to 3° with respect to a basal plane of the substrate material.

19 Claims, 5 Drawing Sheets

OTHER PUBLICATIONS

Wan, et al., "Scaling of chlorosilane SiC CVD to multi-wafer epitaxy system," Materials Science Forum, vols. 556-557, pp. 145-148 (2007).

Myers, et al., "Increased growth rate in a SiC CVD reactor using HCl as a growth additive," Materials Science Forum, vols. 483-485, pp. 73-76 (2005).

Nakamura, et al., "Surface mechanisms in homoepitaxial growth on α-SiC {0001}-vicinal faces," Materials Science Forum, vols. 457-460, pp. 163-168 (2004).

Saitoh, et al., "4H-SiC epitaxial growth on SiC substrates with various off-angles," Materials Science Forum, vols. 483-485, pp. 89-92 (2005).

Hassan, et al., "4H-SiC epitaxial layers grown on on-axis Si-face substrate," Materials Science Forum, vols. 556-557, pp. 53-56 (2007).

Hallin, et al., "Homoepitaxial growth on 4H-SiC substrates by chemical vapor deposition," Materials Research Society Symposium Proceedings, vol. 911, 0911-B09-05 (2006).

Hallin, et al., "Homoepitaxial on-axis growth of 4H- and 6H-SiC by CVD," Materials Science Forum, vols. 457-460, pp. 193-196 (2004).

Koshka, et al., "Epitaxial growth of 4H-SiC at low temperatures using CH3Cl carbon gas precursor: Growth rate, surface morphology, and influence of gas phase nucleation," Journal of Crystal Growth, vol. 294, No. 2, pp. 260-267 (2006).

European Search Report dated Jun. 27, 2011.

Shrivastava et al. "Study of triangular defects and inverted pyramids in 4H-SiC 4° off-cut (0001) Si face epilayers" Journal of Crystal Growth 310 (2008) pp. 4443-4450.

Nakazawa et al. "High-purity 4H-SiC epitaxial growth by hot-wall chemical vapor deposition" Journal of Crystal Growth 237-239 (2002) pp. 1213-1218.

Tsunenobu Kimoto et al. "Growth mechanism of 6H-SiC in step-controlled epitaxy" J. Appl. Phys. 73 (2), Jan. 15, 1993; pp. 726-732.

Sridhara et al. "Photoluminescence and trasport studies of boron in 4H SiC" Journal of Applied Physics, vol. 83, No. 12; Jun. 15, 1998; pp. 7909-7919.

Masahara et al. "High-Rate Epitaxial Growth of 4H-SiC Using a Vertical-Type, Quasi-Hot-Wall CVD Reactor" Materials Science Forum vols. 389-393 (2002) pp. 179-182.

Zhang et al. "Growth characteristics of SiC in a hot-wall CVD reactor with rotation" Journal of Crystal Growth 241 (2002) pp. 431-438.

Kordina, et al. "High temperature chemical vapor deposition of SiC" Appl. Phys. Lett. vol. 69 (No. 10); Sep. 2, 1996; pp. 1456-1458.

Hassan et al. "Epitaxial growth of thin 4H-SiC layers with uniform doping depth profile" Thin Solid Films Elsevier; vol. 515 No. 2; Oct. 25, 2006; pp. 460-463.

Tsuchida et al. "Growth and characterization of the 4H-SiC epilayers on substrates with different off-cut directions" Materials Science Forum vols. 457-460 (2004) pp. 229-232.

* cited by examiner

EPITAXIAL GROWTH ON LOW DEGREE OFF-AXIS SIC SUBSTRATES AND SEMICONDUCTOR DEVICES MADE THEREBY

BACKGROUND

1. Field

This application relates generally to methods of epitaxially growing SiC layers on single crystal SiC substrates and to semiconductor devices made using these methods.

2. Background of the Technology

Silicon carbide possesses properties that make it an excellent semiconductor material for applications that involve high temperature, high power, high radiation and/or high frequency. Properties that contribute to this superior performance are its large bandgap, excellent physical stability, high thermal conductivity, high electric breakdown field, and high saturated electron drift velocity. Semiconductor devices fabricated from SiC are capable of operating at temperatures above 600° C.

SiC occurs in many different crystal structures called polytypes. The SiC polytypes are formed by the stacking of double layers of Si and C atoms. Each double layer may be situated in one of three positions, designated as A, B, and C. The sequence of stacking determines the particular polytype. There is one cubic polytype known as 3C or β-SiC. It has a three-layer repeat sequence ABC. All of the other polytypes are known as α-SiC and have either a hexagonal or rhombohedral structure. The hexagonal 4H—SiC polytype has the four layer repeat sequence ABCB. The hexagonal 6H—SiC polytype has the six layer repeat sequence ABCACB. For the α-SiC polytypes, the (0001) plane is known as the basal plane and this plane is perpendicular to the crystallographic c-axis direction.

Epitaxial growth of SiC is disclosed in the following references: U.S. Pat. No. 7,247,513 and in References [8] and [10]. Homoepitaxial growth of α-SiC has been conducted on an off-axis surface of a substrate (i.e., a surface that is at an angle to the basal plane of the substrate). For example, U.S. Pat. Nos. 4,912,064, 5,011,549 and 5,248,385 disclose homoepitaxial growth of SiC films on 6H—SiC substrates with a non-zero off-axis angle. Other references disclosing epitaxial growth of SiC on the surfaces of substrates with a non-zero off-axis angle include: References [1], [2], [3], [4], [5], [6], [7], [9] and [11]. The use of off-axis substrates results in waste, however, due to the need to slice the single-crystal boule off-axis to the direction of crystallographic growth (i.e., the c direction). As wafer diameters increase, this can result in a significant amount of waste of the expensive single-crystal boule.

Accordingly, there still exists a need for improved methods of epitaxially growing SiC layers on substrates which is cost effective and which produces SiC layers having low defect density.

SUMMARY

A method is provided which comprises:
heating a single-crystal SiC substrate to a first temperature in a chamber;
introducing a carrier gas, a silicon containing gas and carbon containing gas into the chamber; and
epitaxially growing a layer of SiC on a surface of the SiC substrate at the first temperature;
wherein the first temperature is at least 1400° C., wherein the SiC substrate is heated at a rate of at least 30° C./minute to the first temperature and wherein the surface of the SiC substrate is inclined at an angle of from 1° to 3° with respect to a basal plane of the substrate material.

A method is also provided which comprises:
heating a single-crystal SiC substrate to a first temperature of at least 1400° C. in a chamber;
introducing a carrier gas, a silicon containing gas and carbon containing gas into the chamber; and
epitaxially growing a layer of SiC on a surface of the SiC substrate;
wherein the surface of the SiC substrate is inclined at an angle of from 1° to 3° with respect to a basal plane of the substrate material;
wherein the carrier gas, the silicon containing gas and the carbon containing gas are each introduced into the chamber at a constant flow rate during epitaxial growth; and
wherein the constant flow rate of each of the gases is established within 10 minutes of introducing any of the gases into the chamber.

The method may further comprise epitaxially growing one or more additional layers of SiC on the layer of SiC grown on the SiC substrate.

A semiconductor device made by a method set forth above is also provided.

These and other features of the present teachings are set forth herein.

BRIEF DESCRIPTION OF THE DRAWINGS

The skilled artisan will understand that the drawings, described below, are for illustration purposes only. The drawings are not intended to limit the scope of the present teachings in any way.

DESCRIPTION OF THE VARIOUS EMBODIMENTS

For the purposes of interpreting this specification, the use of "or" herein means "and/or" unless stated otherwise or where the use of "and/or" is clearly inappropriate. The use of "a" herein means "one or more" unless stated otherwise or where the use of "one or more" is clearly inappropriate. The use of "comprise," "comprises," "comprising," "include," "includes," and "including" are interchangeable and not intended to be limiting. Furthermore, where the description of one or more embodiments uses the term "comprising," those skilled in the art would understand that, in some specific instances, the embodiment or embodiments can be alternatively described using the language "consisting essentially of" and/or "consisting of." It should also be understood that in some embodiments the order of steps or order for performing certain actions is immaterial so long as the present teachings remain operable. Moreover, in some embodiments two or more steps or actions can be conducted simultaneously.

A method is provided which comprises: heating a single-crystal SiC substrate to a temperature of at least 1400° C. (e.g., 1570 to 1575° C.) in a chamber; introducing a carrier gas, a silicon containing gas and carbon containing gas into the chamber; and epitaxially growing a layer of SiC on a surface of the SiC substrate. The SiC substrate is heated to the temperature of at least 1400° C. at a rate of at least 30°

C./minute. The surface of the SiC substrate is inclined at an angle of from 1° to 3° with respect to a basal plane of the substrate material.

According to some embodiments, the carrier gas, the silicon containing gas and the carbon containing gas are each introduced into the chamber at an approximately constant flow rate (e.g., at a flow rate which varies no more than +/−5%) during epitaxial growth and the approximately constant flow rate of each of these gases is established within 10 minutes (e.g., within 6 minutes) of introducing any of the carrier gas, the silicon containing gas or the carbon containing gas into the chamber.

According to some embodiments, the carrier gas can be $H_2$, the silicon containing gas can be $SiH_4$ and the carbon containing gas can be $C_3H_8$.

The flow rates of the gases into the chamber during epitaxial growth can be chosen to produce desired characteristics. According to some embodiments, the $H_2$ gas can be introduced into the chamber at a flow rate of 50-75 slm, the $SiH_4$ gas can be introduced into the chamber at a flow rate of 30-40 sccm and the $C_3H_8$ can be introduced into the chamber at a flow rate of 15-20 sccm. According to some embodiments, the silicon containing gas and the carbon containing gas can be introduced into the chamber such that the atomic ratio of carbon to silicon in the chamber during epitaxial growth is from 1.4 to 1.6.

According to some embodiments, HCl gas can also be introduced into the chamber during epitaxial growth.

According to some embodiments, the pressure in the chamber during epitaxial growth can be 90 to 110 mbar.

According to some embodiments, the surface of the SiC substrate can be inclined at an angle of from 11 to 3° with respect to the (0001) plane (i.e., the basal plane) of the substrate material. For example, the surface of the SiC substrate can inclined at an angle of from 1° to 3° towards one of the [1120] directions with respect to the (0001) plane of the substrate material.

According to some embodiments, the substrate can be a 4H SiC substrate.

According to some embodiments, the total defect count for the substrate and the epitaxially grown layer can be <40 cm². According to some embodiments, the average surface roughness of the epitaxially grown layer as measured in an optical profilometer can be 15 Angstroms or less.

According to some embodiments, the method can comprise epitaxially growing one or more additional layers of SiC on the layer of SiC epitaxially grown on the substrate.

A semiconductor device made by a method as set forth above is also provided.

EXPERIMENTAL

Ten 3 inch, 350 μm 4H SiC substrates cut approximately 2° off-axis from the basal plane with the Si-face prepared epi ready were used. Epitaxial growth was performed on these substrates.

The substrates used in these experiments had the following properties.

| WAFER | MPD (cm$^{-2}$) | Rho (Ohm * cm) | Bow (μm) | Warp (μm) | TTV (μm) |
|---|---|---|---|---|---|
| 1 | 8 | $1.49 \times 10^{-2}$ | −2 | 8.25 | 2 |
| 2 | 8 | $1.48 \times 10^{-2}$ | −2 | 9.09 | 2 |
| 3 | 9 | $1.48 \times 10^{-2}$ | −1 | 9.45 | 1 |
| 4 | 9 | $1.48 \times 10^{-2}$ | −2 | 8.82 | 3 |
| 5 | 9 | $1.47 \times 10^{-2}$ | −2 | 8.04 | 3 |
| 6 | 9 | $1.46 \times 10^{-2}$ | −2 | 9.12 | 3 |

The substrate were inspected under an optical microscope with Nomarski contrast and the summary of the results is given in the Table below.

| WAFER | 3x particulates | 3x Carbon Inclusions | 3x Scratches | 3x Defects (cm²) | 50x Scratches | 50x Particles/ Staining | 50x Substrate Defects | 50x Defects cm² |
|---|---|---|---|---|---|---|---|---|
| 1 | 1 | 0 | 0 | 0.03 | 0 | 3 | 87 | 16.85 |
| 2 | 2 | 0 | 0 | 0.05 | 0 | 5 | 94 | 18.30 |
| 3 | 2 | 0 | 0 | 0.05 | 0 | 27 | 103 | 23.73 |
| 4 | 0 | 0 | 0 | 0.00 | 0 | 5 | 125 | 24.09 |
| 5 | 1 | 0 | 0 | 0.03 | 0 | 5 | 158 | 29.53 |
| 6 | 2 | 0 | 0 | 0.05 | 0 | 5 | 145 | 27.36 |

Cross polar images were taken. The cross-polar images of substrate wafers 1-6 are shown in FIGS. 1A-1F, respectively.

Six runs were conducted in a reactor on the 3 inch 2° off-axis substrates. The first run employed a standard condition used for epitaxially growing SiC on 4° off-axis substrates and included HCl gas. Runs 2-4 adopted slightly modified process conditions to examine the effects of the process parameters on the epilayer surface morphology. Runs 5-6 selected one of the best process conditions from Runs 1-4 (i.e., Run 2) and modified the heat-up and the initial growth procedure.

The process details for each of these runs are listed in the Table below.

| Run | Wafer | Thickness (μm) | Growth Rate (μm/h) | Temp. (° C.) | $SiH_4$ Flow (sccm) | $C_3H_8$ Flow (sccm) | $H_2$ Flow (slm) | HCl Flow (sccm) | Pressure (mbar) |
|---|---|---|---|---|---|---|---|---|---|
| 1 | 5 | 4.55 | 7.91 | 1580-1585 | 35 | 17.5 | 60 | 35 | 100 |
| 2 | 6 | 4.17 | 7.34 | 1570-1575 | 35 | 17.5 | 65 | 35 | 100 |
| 3 | 3 | 5.57 | 6.83 | 1560-1565 | 28 | 14 | 60 | 35 | 100 |
| 4 | 2 | 5.55 | 6.73 | 1580-1585 | 28 | 14 | 60 | 28 | 100 |
| 5 | 4 | 4.88 | 7 | 1570-1575 | 35 | 17.5 | 65 | 35 | 100 |
| 6 | 1 | 3.7 | 7 | 1570-1575 | 35 | 17.5 | 65 | 35 | 100 |

In the above Table, "sccm" denotes "standard cubic centimeters per minute" and "slm" denotes "standard cubic liters per minute". For Run 5, the initial growth with low precursor flows (low growth rate) was extended to a longer time (i.e., 27 minutes compared with 10 minutes). For Run 6, the heat-up time was reduced from 60 minutes to 42 minutes and the initial growth with low precursor flow (i.e., before the stable process flows were established) was 5 minutes.

The surface roughness and defect count information are given in the Table below.

| Run | Wafer | Zygo Ra (A) | | | | Triangle Count (per wafer) | Thickness (μm) | Growth Rate (μm/h) |
| --- | --- | --- | --- | --- | --- | --- | --- | --- |
| | | Major Flat | Center | Opp-Major-Flat | Average | | | |
| 1 | 5 | 21.4 | 26.5 | 22.2 | 23.4 | 42 | 4.55 | 7.91 |
| 2 | 6 | 14 | 22.8 | 17.1 | 39 | 39 | 4.17 | 7.34 |
| 3 | 3 | 19.5 | 23.8 | 18.9 | 104 | 104 | 5.57 | 6.83 |
| 4 | 2 | 28.6 | 30.9 | 27.4 | 47 | 47 | 5.55 | 6.73 |
| 5 | 4 | 73.5 | 56.1 | 57.4 | 79 | 79 | 4.88 | 7 |
| 6 | 1 | 13.5 | 14.1 | 10.7 | 23 | 23 | 3.7 | 7 |

Figure 1A:
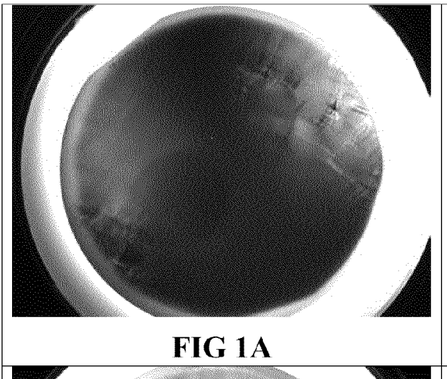
FIGS. 1A-1F are cross polar images of SiC substrates cut 2° off-axis from the basal plane.
Figure 1B:
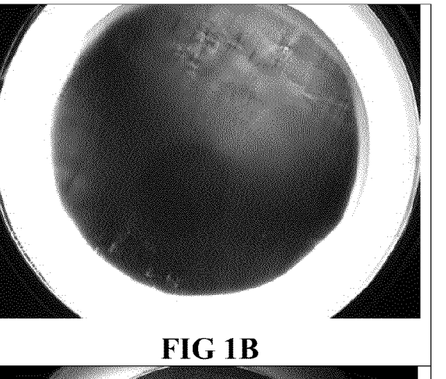
Figure 1C:
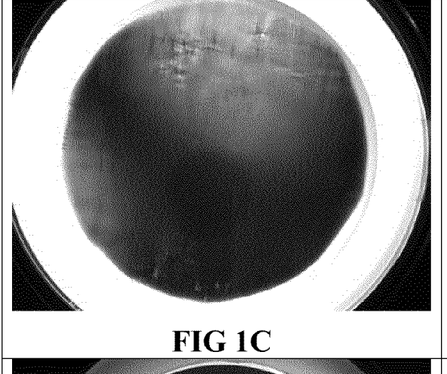
Figure 1D:
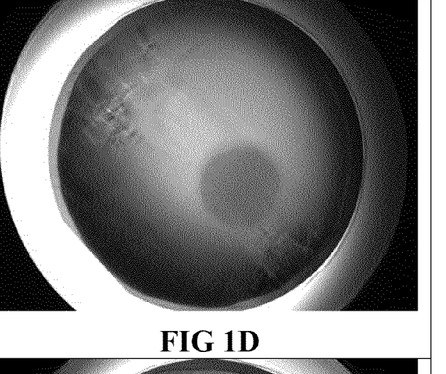
Figure 1E:
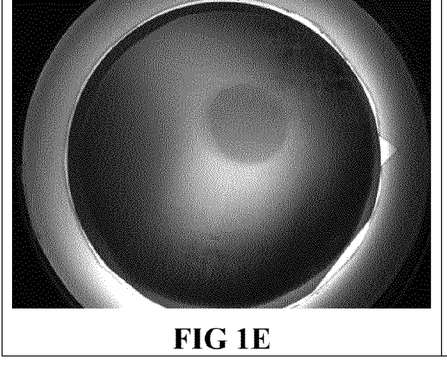
Figure 1F:
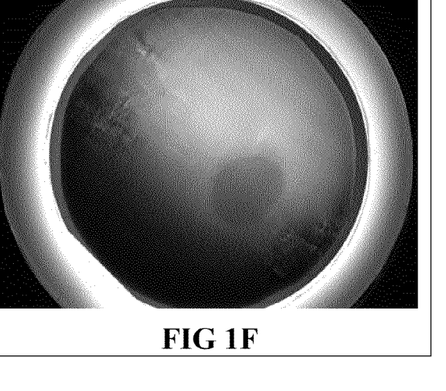
Figure 2A:
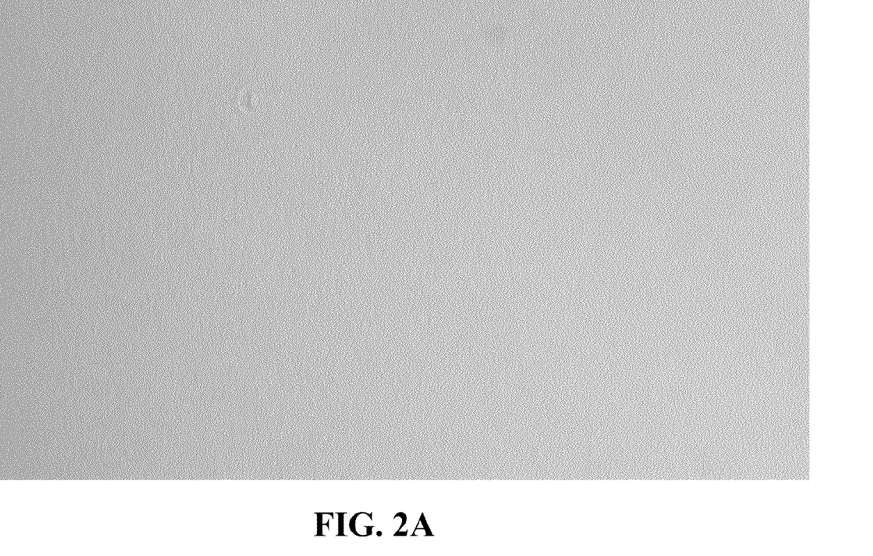
FIGS. 2A-2D are optical microscope images of SiC layers epitaxially grown under different process conditions on SiC substrates cut 2° off-axis from the basal plane.
Figure 2B:
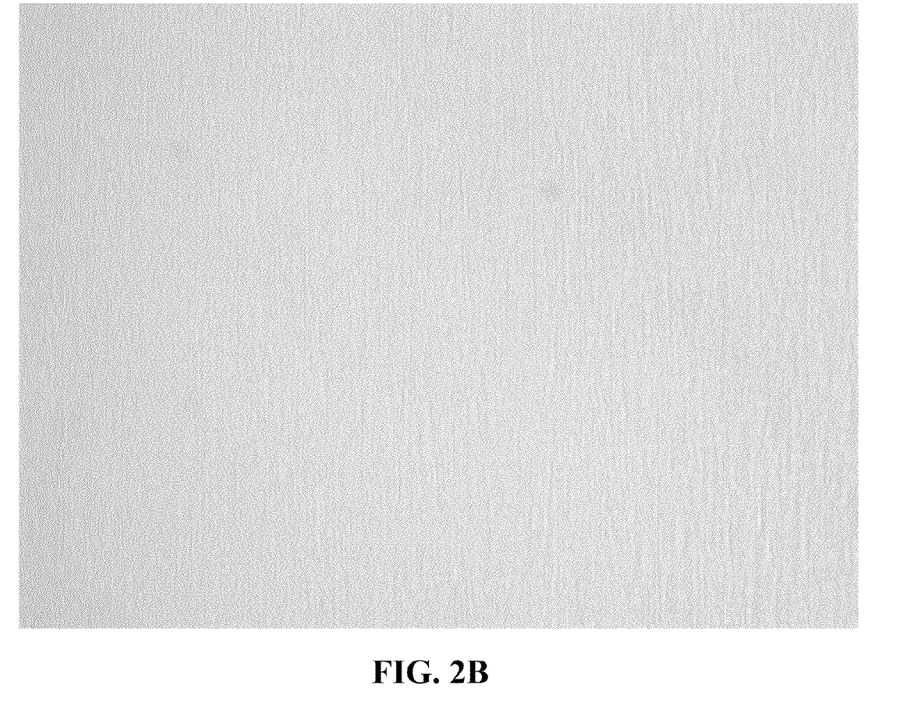
Figure 2C:
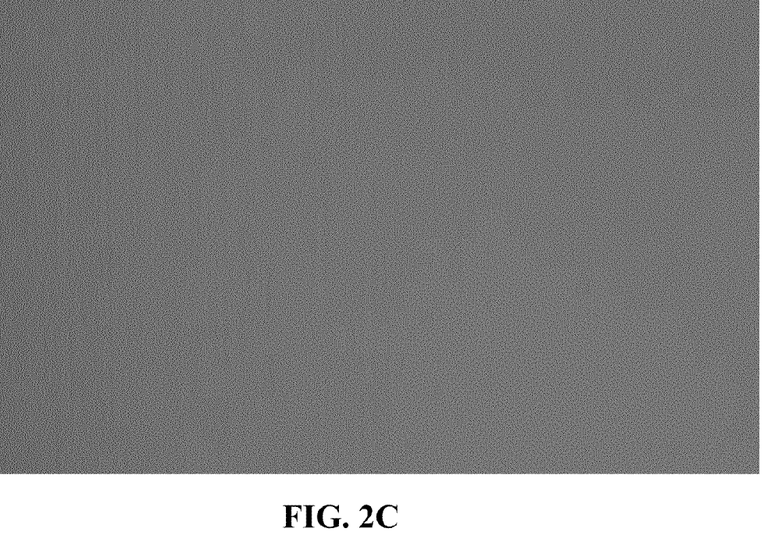
Figure 2D:
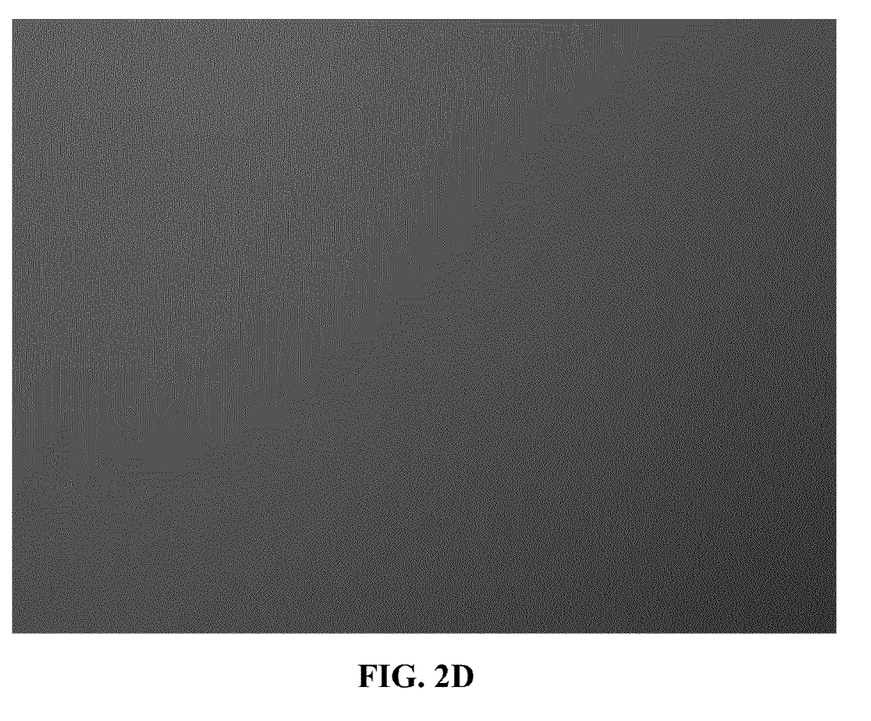

Typical microscope images are provided in FIGS. 2A-2D. FIG. 2A is an image of the epiwafer from Run 2. FIG. 2B is an image of the epiwafer from Run 4. FIG. 2C is an image of the epiwafer from Run 6. FIG. 2D is an image of the epiwafer from Run 5.

For the runs using the same heat-up and initial growth procedure (i.e., Runs 1-4), the best surface was obtained with a slightly lower temperature. However, if the temperature is reduced too much, a large amount of triangular defects are likely to appear due to the low off-axis substrate.

The results from Runs 5 and 6 show that a quicker heat-up and a fast transition from initial growth to stable growth conditions improves surface roughness as well as defect count. Run No. 5 exhibited very slow growth at the beginning of the process for a longer time. Run No. 6 exhibited faster heat-up and a short time for initial growth. Run No. 5 exhibited a much higher defect count and surface roughness values than Run No. 6.

While not wishing to be bound by theory, it appears that it may be desirable to suppress unwanted etching prior to stable growth.

The above experimental results can be summarized as follows.

The epitaxial layers grown on the 2° off-axis substrates are rougher and display more triangle defects than epitaxial layers grown on higher (i.e., 4°) off-axis substrates. Using the standard process conditions in the research reactor, the Zygo measured surface roughness Ra increased from 11.7 Angstroms to 23.4 Angstroms and the triangle count increased from below 5 to above 40 per wafer for the 2° off-axis substrates.

A slightly lower temperature seemed to improve the surface roughness to 18 Angstroms and the triangle defect count did not change noticeably. A further reduced temperature, however, may be expected to result in a higher triangle count.

The heat-up and initial growth procedure may also affect the surface roughness and defect count. Using a procedure with a faster heat-up and a quicker transition from initial growth to stable growth, the surface roughness improved to 13 Angstroms and the defect count was reduced as well.

Degraded surface roughness and the higher triangle defect count are expected from epitaxial growth on the lower angle substrates. The total defect count (i.e., both epitaxial and substrate defects) on the 2° epitaxial material ranged from 15 to 35 $cm^{-2}$.

While the foregoing specification teaches the principles of the present invention, with examples provided for the purpose of illustration, it will be appreciated by one skilled in the art from reading this disclosure that various changes in form and detail can be made without departing from the true scope of the invention.

REFERENCES

[1] La Via et al., "Very high growth rate epitaxy processes with chlorine addition", Materials Science Forum Vols. 556-557 (2007), pp. 157-160.

[2] La Via et al., "Epitaxial layers grown with HCl addition: A comparison with the standard process", Materials Science Forum Vols. 527-529 (2006), pp. 163-166.

[3] Crippa et al., "New achievements on CVD based methods for SiC epitaxial growth", Materials Science Forum Vols. 483-485 (2005), pp. 67-72.

[4] Wan et al., "Scaling of chlorosilane SiC CVD to multi-wafer epitaxy system", Materials Science Forum Vols. 556-557 (2007), pp. 145-148.

[5] Myers et al., "Increased rate in a SiC CVD reactor using HCl as a growth additive", Materials Science Forum Vols. 483-485 (2005), pp. 73-76.

[6] Nakamura et al., "Surface mechanisms in homoepitaxial growth on α-SiC {0001}-vicinal faces", Materials Science Forum Vols. 457-460 (2004), pp. 163-168.

[7] Saitoh et al., "4H—SiC epitaxial growth on SiC substrates with various off-angles", Materials Science Forum Vols. 483-485 (2005), pp. 89-92.

[8] Hassan et al., "4H—SiC epitaxial layers grown on on-axis Si-face substrates", Materials Science Forum Vols. 556-557 (2007), pp. 53-56.

[9] Hallin et al., "Homoepitaxial growth on 4H—SiC substrates by chemical vapor deposition", Materials Research Symposium Proceedings, vol. 911 (2006), 0911-B09-05.

[10] Hallin et al., "Homoepitaxial on-axis growth of 4H— and 6H—SiC by CVD", Materials Science Forum Vols. 457-460 (2004), pp. 193-196.

[11] Koshka et al., "Epitaxial growth of 4H—SiC at low temperatures using $CH_3Cl$ carbon gas precursor: Growth rate, surface morphology, and influence of gas phase nucleation", Journal of Crystal Growth Vol. 294 (2) (2006), pp. 260-267.

What is claimed is:
1. A method comprising:
  heating a single-crystal SiC substrate to a first temperature of at least 1400° C. in a chamber;
  introducing a carrier gas, a silicon containing gas and carbon containing gas into the chamber; and epitaxially growing a layer of SiC on a surface of the SiC substrate;

wherein the SiC substrate is heated to the first temperature at a rate of at least 30° C./minute; and wherein the surface of the SiC substrate is inclined at an angle of from 1° to 3° with respect to a basal plane of the substrate material;

wherein the carrier gas, the silicon containing gas and the carbon containing gas are each introduced into the chamber at a constant flow rate during epitaxial growth and wherein the constant flow rate of each of the gases is established within 10 minutes of introducing any of the gases into the chamber.

2. The method of claim 1, wherein the first temperature is 1570 to 1575° C.

3. The method of claim 1, wherein the carrier gas is $H_2$, the silicon containing gas is $SiH_4$ and wherein the carbon containing gas is $C_3H_8$.

4. The method of claim 3, wherein the $H_2$ gas is introduced into the chamber at a flow rate of 50-75 slm, the $SiH_4$ gas is introduced into the chamber at a flow rate of 30-40 sccm and the $C_3H_8$ is introduced into the chamber at a flow rate of 15-20 sccm.

5. The method of claim 1, wherein HC1 gas is introduced into the chamber during epitaxial growth.

6. The method of claim 1, wherein the pressure in the chamber during epitaxial growth is 90 to 110 mbar.

7. The method of claim 1, wherein the surface of the SiC substrate is inclined at an angle of from 1° to 3° with respect to the (0001) plane of the substrate material.

8. The method of claim 1, wherein the substrate is a 4H SiC substrate.

9. The method of claim 7, wherein the surface of the SiC substrate is inclined at an angle of from 1° to 3° towards one of the [1120] directions with respect to the (0001) plane of the substrate material.

10. The method of claim 1, wherein the silicon containing gas and the carbon containing gas are introduced into the chamber such that the atomic ratio of carbon to silicon in the chamber during epitaxial growth is from 1.4 to 1.6.

11. The method of claim 1, wherein the total defect count for the substrate and epitaxially grown layer is <40 $cm^{-2}$.

12. The method of claim 1, wherein the average surface roughness of the epitaxially grown layer as measured in an optical profilometer is 15 Angstroms or less.

13. The method of claim 1, further comprising epitaxially growing one or more additional layers of SiC on the layer of SiC epitaxially grown on the SiC substrate.

14. The method of claim 1, wherein the constant flow rate varies by no more than 5% during epitaxial growth.

15. The method of claim 1, wherein the constant flow rate of each of the gases is established within 6 minutes of introducing any of the gases into the chamber.

16. The method of claim 1, wherein the carrier gas is $H_2$.

17. The method of claim 1, wherein the substrate is heated to the first temperature in 42 minutes or less.

18. The method of claim 1, wherein the constant flow rate of each of the carrier gas, the silicon containing gas and the carbon containing gas is established within 5 minutes of introducing any of the gases into the chamber.

19. The method of claim 1, wherein the substrate is heated to the first temperature in 42 minutes or less and wherein the constant flow rate of each of the carrier gas, the silicon containing gas and the carbon containing gas is established within 5 minutes of introducing any of the gases into the chamber.

* * * * *